(12) United States Patent  (10) Patent No.: US 6,343,011 B1
Yu  (45) Date of Patent: Jan. 29, 2002

(54) SCREWLESS WIND CONDUIT POSITIONING DEVICE

(75) Inventor: Chao-Hsuan Yu, Taoyuan (TW)

(73) Assignee: Lite-On Enclosure Inc., Taipei (TW)

( * ) Notice: Subject to any disclaimer, the term of this patent is extended or adjusted under 35 U.S.C. 154(b) by 0 days.

(21) Appl. No.: 09/631,767

(22) Filed: Aug. 3, 2000

(51) Int. Cl.[7] ................................................ H05K 7/20
(52) U.S. Cl. .................. 361/695; 361/390; 361/694; 174/16.1; 165/104.33
(58) Field of Search ................................ 261/687, 690, 261/694, 695; 174/16.1, 16.3; 165/80.3, 185; 312/223.2; 454/184

(56) References Cited

U.S. PATENT DOCUMENTS

| | | | | |
|---|---|---|---|---|
| 5,707,282 A | * | 1/1998 | Clements et al. | 454/184 |
| 5,713,790 A | * | 2/1998 | Lin | 454/184 |
| 5,788,566 A | * | 8/1998 | McAnally et al. | 361/695 |
| 6,102,296 A | * | 8/2000 | Snider | 361/695 |
| 6,215,659 B1 | * | 4/2001 | Chen | 361/695 |

\* cited by examiner

Primary Examiner—Gerald Tolin
Assistant Examiner—Boris L. Chervinsky
(74) Attorney, Agent, or Firm—Rosenberg, Klein & Lee

(57) ABSTRACT

A screwless wind conduit positioning device serves to position a wind conduit to a rear plate of a computer mainframe. The wind conduit is a curved tube having a heat dissipating fan at its lateral side. A front surface the wind conduit are formed with a plurality of tenons and hooks which are arranged at opposite sides. The rear plate of the computer mainframe has a thin plate on the surface thereof. The thin plate has a section with a plurality of wind vents arranged like the net. The periphery of the wind vents are installed with a plurality of engaging holes for being engaged with the tenons of the wind conduit. The hooks on the front surface of the wind conduit slide in a bank of wind vents on the section of the thin plate for being retained therein. Therefore, the wind conduit can be fixed to the rear plate of a computer mainframe without using any tool. Then a lateral plate with a folding plate is hooked to the rear plate, and then screws serve to fix the lateral plate to the rear plate. The folding plate serves to enhance and confine the tenons. Even it is transferred, the wind conduit will not separate from the rear plate.

7 Claims, 5 Drawing Sheets

SCREWLESS WIND CONDUIT POSITIONING DEVICE

FIELD OF THE INVENTION

The present invention relates to a screwless wind conduit positioning device, which is designed for a housing of a computer mainframe. By the present invention, the wind conduit can be buckled to the computer mainframe without any tool, moreover, the present invention can be used in home used electric device (for example television) or electronic instrument (for example projector).

BACKGROUND OF THE INVENTION

The prior art wind conduit of a computer mainframe is fixed by screws. The wind conduit is directly fixed to the wind outlet at the rear plate of a computer mainframe. Since it is necessary to use a screw opener and other tools. Therefore, the speed of assembly is reduced and the cost in mounting is increased. Therefore, there is eager demand for a novel device to improve this defect in the prior art.

SUMMARY OF THE INVENTION

Accordingly, the primary object of the present invention is to provide a screwless wind conduit positioning device, in which in the rear plate of a computer mainframe, the peripheral of a section with wind vents arranged as a net is formed with a plurality of engaging holes for being buckled by the tenons installed in the front surface of the wind conduit. A bank of wind vents on the section with engaging vents arranged as a net can be positioned by hooks in the front face of the wind conduit by sliding therein. Then, a lateral plate with folding plate is hanged therein. Further, a folding plate is used to confine the movement of the tenons.

After the wind conduit is buckled to the rear plate of a computer mainframe, it can be assembled therein manually without any tool. This is the object of the present invention.

The various objects and advantages of the present invention will be more readily understood from the following detailed description when reading in conjunction with the appended drawing.

DETAILED DESCRIPTION OF THE PREFERRED EMBODIMENTS

In order for those skilled in the art to understand the structure, function, characteristics and content of the present invention, the detail of the present invention will be described in the following with the appended figures. However, these description and the appended figures are only used to describe the present invention instead of confining the scope and spirit of the present invention defined in the appended claim.

Figure 1:
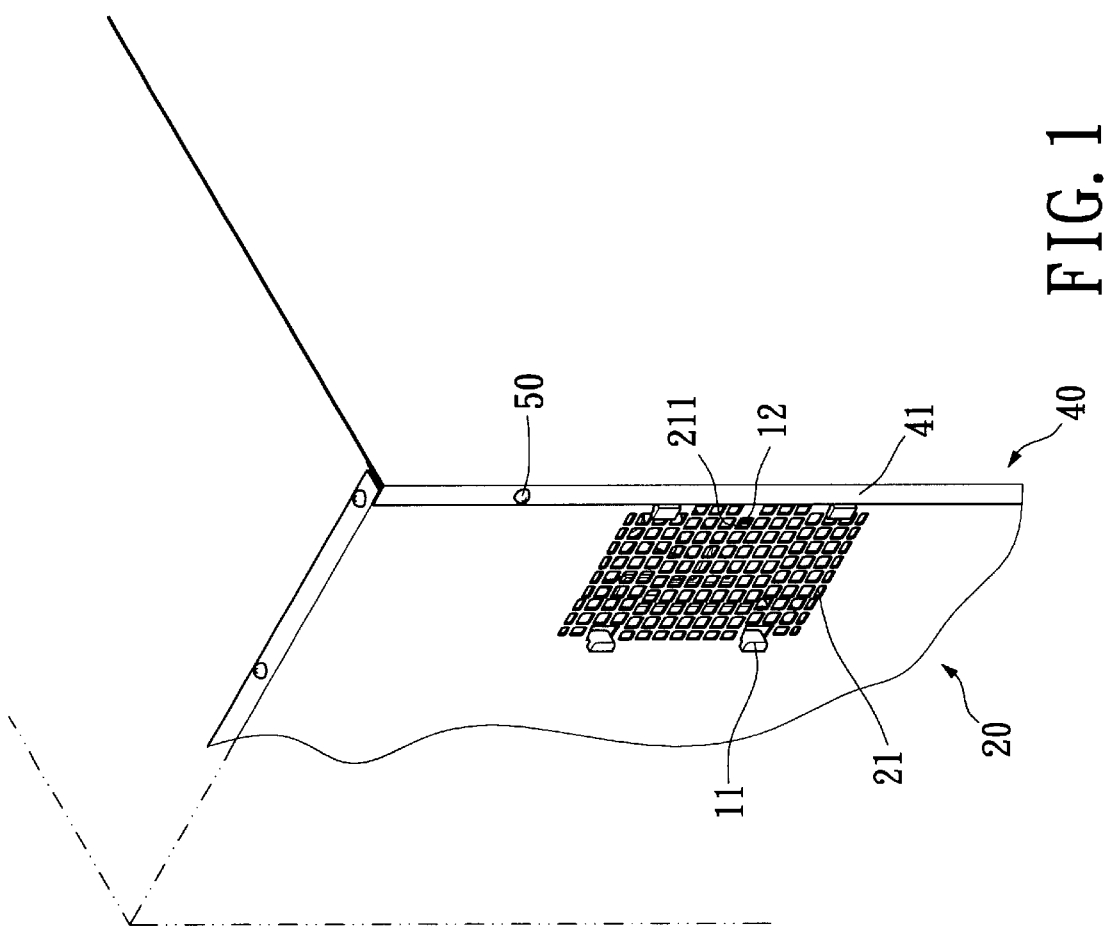
FIG. 1 is a perspective view of the screwless wind conduit positioning device in the present invention.
Figure 2:
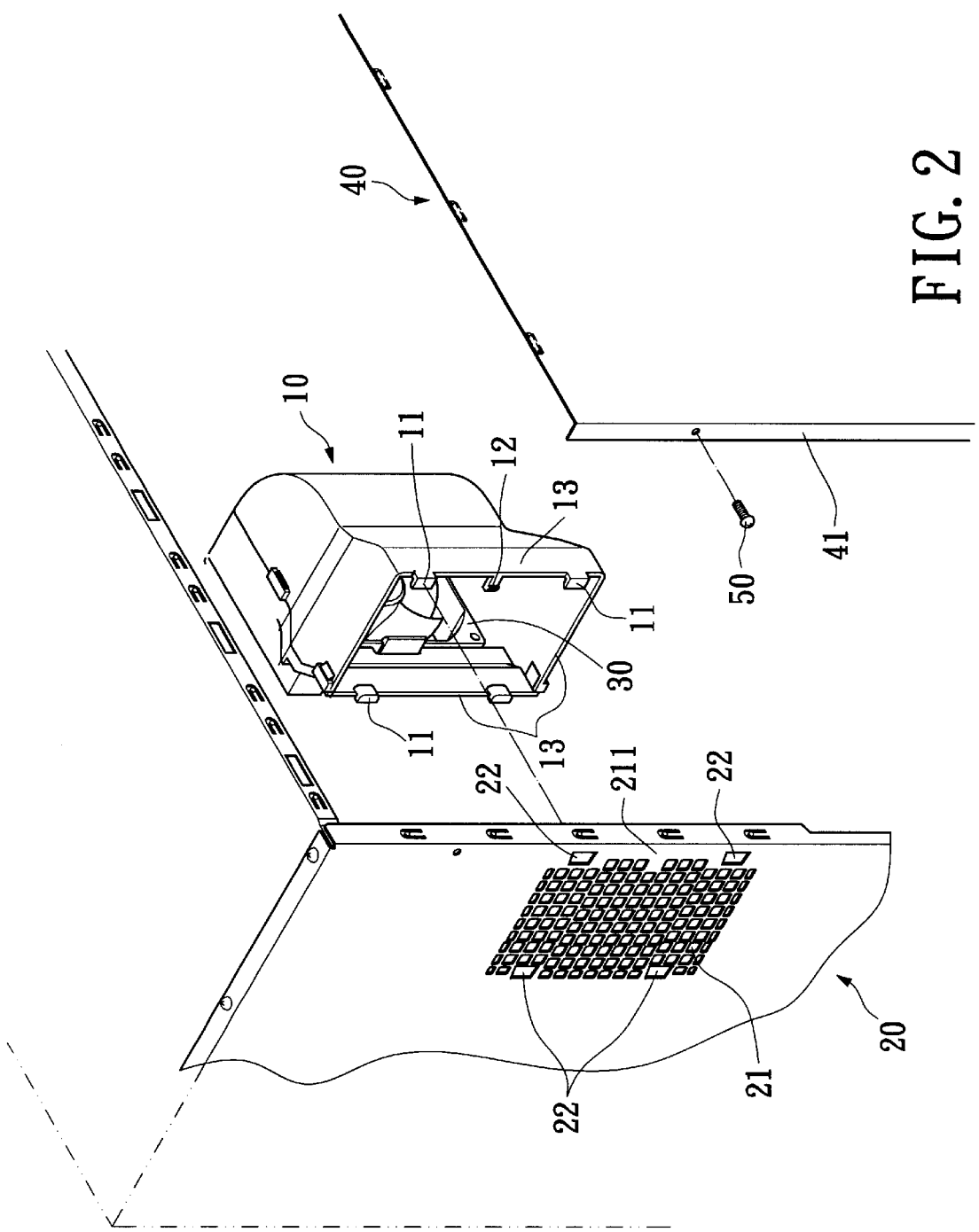
FIG. 2 is an exploded view of the screwless wind conduit positioning device in the present invention.

With reference to FIGS. 1 and 2, the exploded view and perspective view of the screwless wind conduit positioning device according to the present invention is illustrated. In the screwless wind conduit positioning device, a wind conduit 10 is connected to a rear plate 20 of a computer mainframe 10. The lateral side of the wind conduit 10 is buckled with a curved tube of a heat dissipating fan 30. The front surface of the wind conduit 10 is installed with tenons 11 and hooks 12 which are arranged at opposite sides. The surface of the rear plate 20 of the computer mainframne is formed with a thin plate having a plurality of wind holes 21 which are distributed in a section. The periphery of the section having wind vents 21 is formed with a plurality of engaging holes 22 for being engaged by the tenons 11 of the wind conduit 10, and the hooks 12 at the front face of the wind conduit 10 slide along a bank of wind vents 21 in the lattice section to be retained therein. Therefore, without any tools, the wind conduit 10 can be fixed to the rear plate 20 of the computer mainframe such that the front surface of tile wind conduit 10 is in contact with the rear plate 20 without any vibration. Then, a lateral plate 40 having a folding plate 41 may be placed in position. Finally, screws 50 serve to fix the lateral plate 40 to the rear plate 20. The folding plate 41 serves to reinforce and confine the tenons 11. Even during transport of the computer mainframe, the wind conduit 10 will not separate from the rear plate 20.

Figure 3:
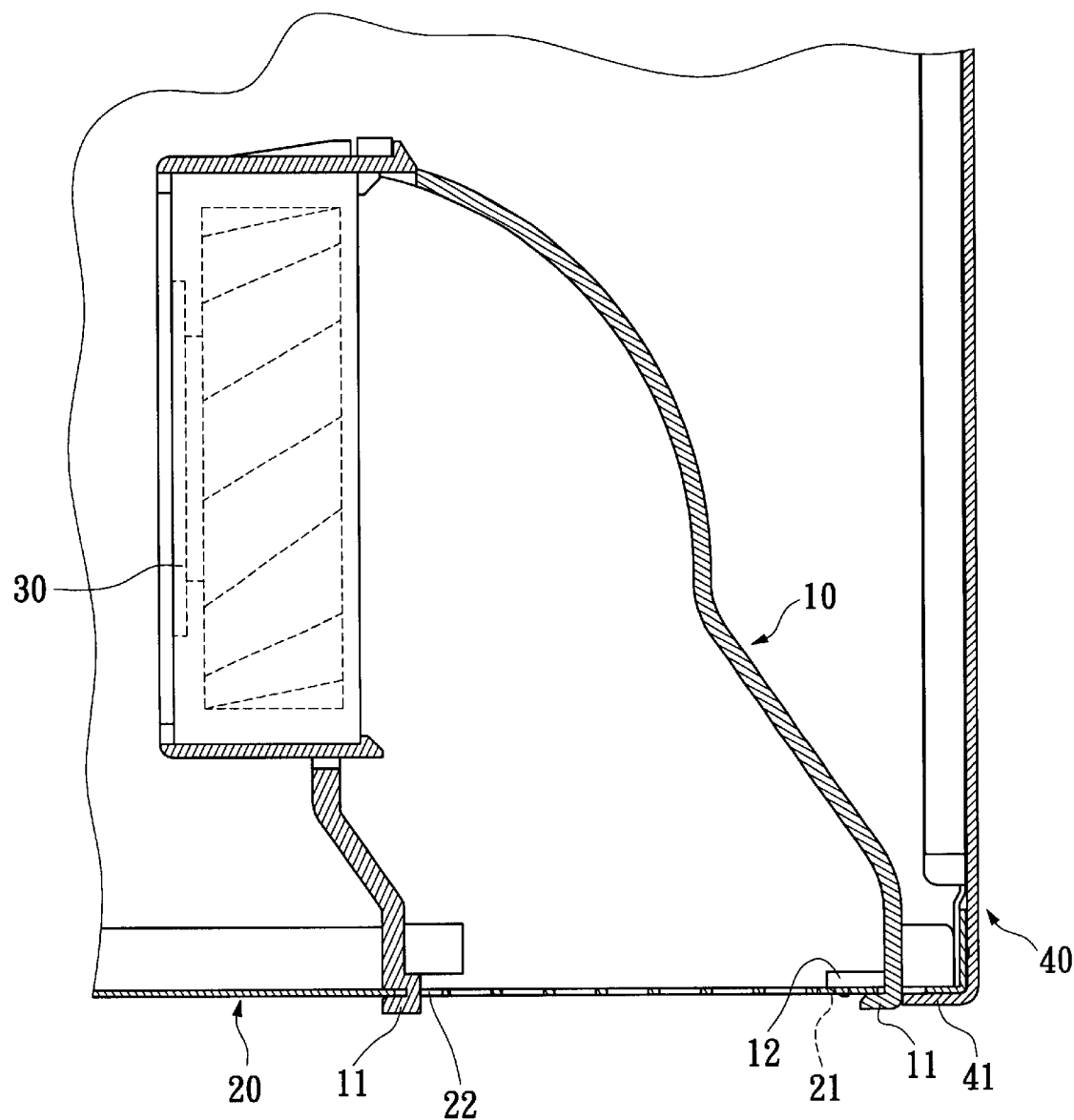
FIG. 3 is a cross sectional view of the screwless wind conduit positioning device in the present invention.

As shown in FIG. 3, the cross sectional view of the present invention is illustrated. In the figure, it is shown that the tenons 11 of the wind conduit 10 are engaged to the engaging holes 22. Meanwhile, the hooks 12 slide to be buckled with a bank of wind vents 21. Furthermore, the folding plate 41 of the lateral plate 40 resists against the tenons 11. After the lateral plate 40 is taken down, the hooks 12 may be disengaged from the wind vents 21, and the wind conduit 10 may be pushed to disengage the tenons 11 from the engaging holes 22.

Figure 4:
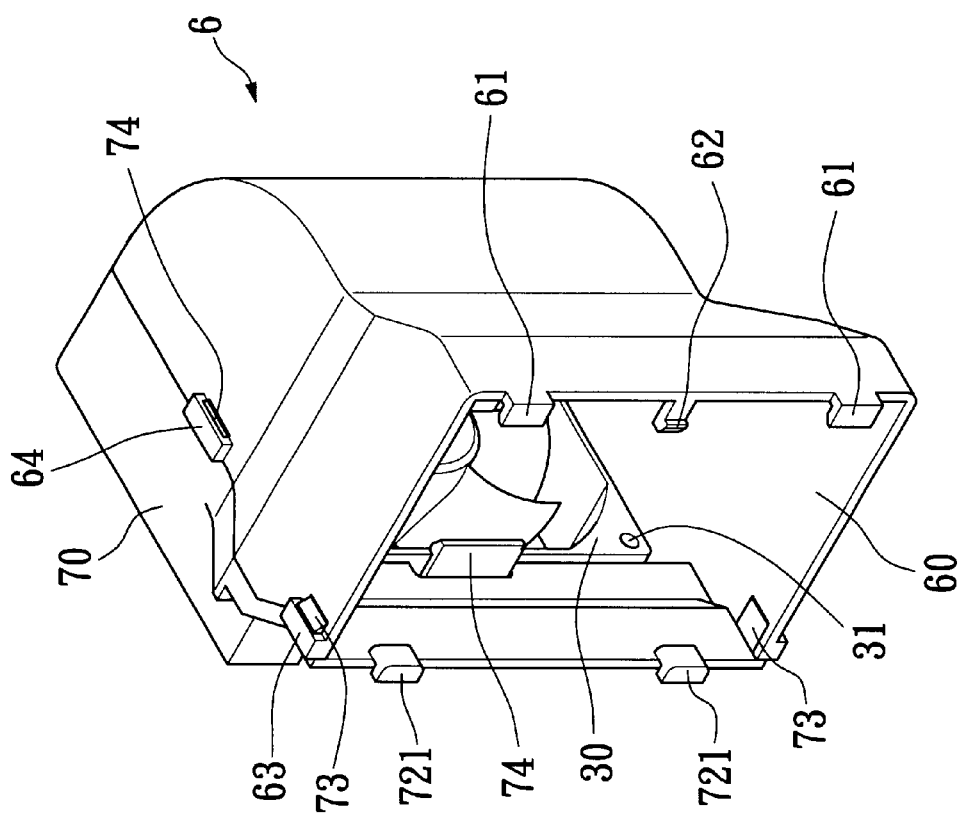
FIG. 4 is a perspective view of a wind conduit in the present invention.
Figure 5:
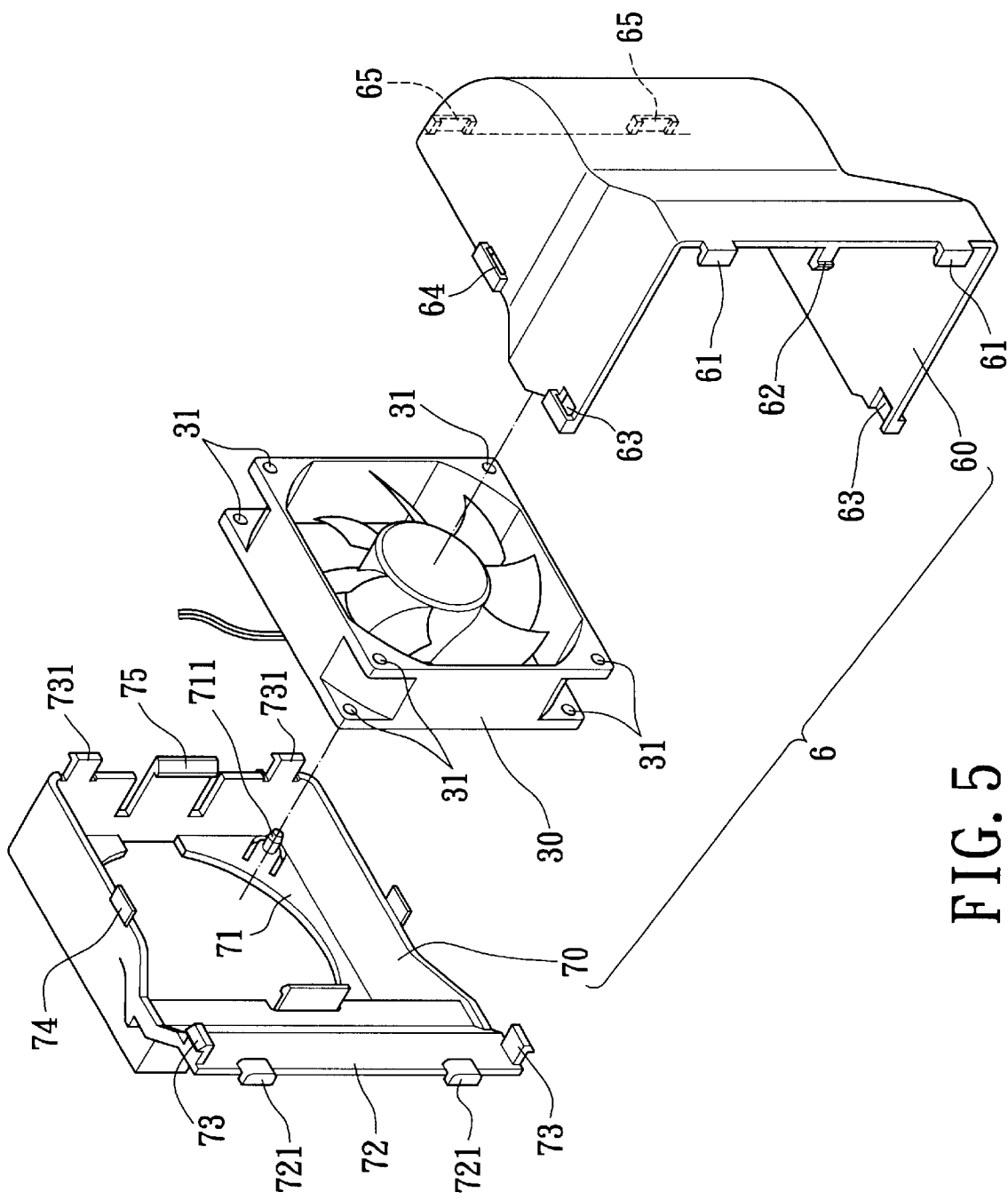
FIG. 5 is an exploded perspective view of the wind conduit of the present invention.

With reference to FIGS. 4 and 5, a perspective view and a exploded view of the wind conduit in the present invention are illustrated. In the figures, the wind conduit 6 includes a groove casing 60 and a frame casing 70. The groove casing 60 is the thin casing with two openings. The lateral edges of the front surface of the groove casing 60 are formed with a plurality of tenons 61 and a plurality of hooks 62. The top and bottom at one side of the groove casing 60 are formed with respective a hook groove 63 and a guide groove 64. The rear side of the groove casing 60 is installed with a plurality of hook groove 65. Another lateral side of the frame casing 70 is extended with a protruding plate 72. The front end of the protruding plate 72 is installed with a plurality of tenons 721 oriented in the same direction as the tenons 61 of the groove casing. The upper and lower ends of the protruding plate 72 are formed with a plurality of hooks 73 engaged with the hook groove 63. Further, another end of the frame casing 70 is installed with hooks 731 engaged with the hook groove 65 of the groove casing and a guide 74 engaged with the guide groove 64 of the groove casing. Next, the upper side of the flange 71 is installed with a plurality of positioning post 711 for passing through and positioning on the positioning holes at four corners of the fan 30. Two opposite lateral walls of the frame casing 70 are disposed with inner hooks 75 for retaining the heat dissipating fan 30.

In summary, the present invention provides with a screwless wind conduit positioning device. Thereby, the wind conduit can be fixed to the rear plate of a computer mainframe without needing any tool. Even the wind conduit is fixed to the rear plate of a computer mainframe, by the folding plate on the lateral plate, the movement of the tenons can be confined.

Although the present invention has been described with reference to the preferred embodiments, it will be understood that the invention is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. An air conduit apparatus for a computer housing comprising:

a first housing plate member having formed through at least a portion thereof a plurality of vent openings and a plurality of engaging holes;

a conduit assembly coupled to said first housing plate, said conduit assembly including a front peripheral portion having a plurality of tenons and at least one hook formed to project therefrom, said tenons each retentively engaging one of said engaging holes, said hook retentively engaging at least one of said vent openings; and, a second plate having a folding plate portion fastened to said first plate, said folding plate portion confining said conduit assembly to maintain said tenons engaged with said first plate engaging holes.

2. The air conduit apparatus as recited in claim 1 wherein said wind conduit assembly includes a side peripheral portion offset from said front peripheral portion, said side peripheral portion being coupled to a heat dissipating fan.

3. The air conduit apparatus as recited in claim 1 wherein said conduit assembly includes a groove casing and a frame casing coupled thereto.

4. The air conduit apparatus as recited in claim 3 wherein said groove casing having formed peripherally thereon a plurality of hook grooves and guide grooves spaced one from the others.

5. The air conduit apparatus as recited in claim 4 wherein said frame casing includes first and second end portions, and at least one flange extending therebetween, said first end portion having a protruding plate portion extending therefrom, said protruding plate portion having a plurality of protruding tenons and hooks, each said hook engaging one of said hook grooves of said groove casing, said second end portion second end portion defining a plurality of hooks each engaging one of said hook grooves of said groove casing.

6. The air conduit apparatus as recited in claim 5 wherein said frame casing further includes a plurality of guide pieces extending therefrom, each said guide piece engaging one said guide groove of said groove casing.

7. The air conduit apparatus as recited in claim 6 wherein said frame casing further includes a plurality of positioning posts extending transversely from said flange, and at least a pair of inner hooks transversely extending respectively from said first and second end portions of said frame casing.

* * * * *